United States Patent [19]
Okura

[11] Patent Number: 5,831,438
[45] Date of Patent: Nov. 3, 1998

[54] DEVICE FOR TESTING A CONNECTOR HAVING MULTIPLE TERMINALS THEREIN

[75] Inventor: Yoshio Okura, Yokkaichi, Japan

[73] Assignee: Sumitomo Wiring Systems, Ltd., Japan

[21] Appl. No.: 797,045

[22] Filed: Feb. 10, 1997

[30] Foreign Application Priority Data

Feb. 16, 1996 [JP] Japan .................................. 8-029757

[51] Int. Cl.$^6$ ................................................. G01R 31/04
[52] U.S. Cl. ...................... 324/538; 324/754; 324/761; 439/489
[58] Field of Search .................................. 324/537, 538, 324/754, 761, 158.1; 439/310, 488, 489, 490

[56] References Cited

U.S. PATENT DOCUMENTS

| | | | |
|---|---|---|---|
| 5,429,519 | 7/1995 | Murakami et al. | 439/310 |
| 5,455,515 | 10/1995 | Saijo et al. | 324/538 |
| 5,614,820 | 3/1997 | Aoyama et al. | 324/538 |
| 5,670,884 | 9/1997 | Kodama | 324/538 |
| 5,689,191 | 11/1997 | Kashiyama | 324/538 |
| 5,694,043 | 12/1997 | Kodama | 324/538 |
| 5,701,079 | 12/1997 | Yagi et al. | 324/538 |

FOREIGN PATENT DOCUMENTS

| | | |
|---|---|---|
| 649028 | 4/1995 | European Pat. Off. . |
| 671789 | 9/1995 | European Pat. Off. . |
| 3920517 | 2/1990 | Germany . |
| 7114963 | 5/1995 | Japan . |
| 2169153 | 7/1986 | United Kingdom . |

*Primary Examiner*—Diep N. Do
*Attorney, Agent, or Firm*—Jordan B. Bierman; Bierman, Muserlian and Lucas

[57] ABSTRACT

A device for testing a connector which has a plurality of terminals, each in a terminal chamber. There is a flexing space adjacent each chamber and a resilient tongue, biased into the chamber, is moved into the space as the terminals are inserted and springs out of the space when they are fully within the chambers. The device has a plurality of testing units attached within a body which is movable toward and away from the connector. If at least one of the terminals is not fully inserted into its chamber, the body is moved backward away from the connector so that contact between the units and the terminals is not made.

13 Claims, 5 Drawing Sheets

DEVICE FOR TESTING A CONNECTOR HAVING MULTIPLE TERMINALS THEREIN

This Application claims the benefit of the priority of Japanese Application 8-29757, filed Feb. 16, 1996.

The present Invention is directed to a device for testing connectors; more particularly, a device which will determine whether a terminal has been fully inserted into its housing.

BACKGROUND OF THE INVENTION

A typical prior art device is shown in FIG. 6. Connector 1 comprises a plurality of holding chambers 2, which is adapted to receive a corresponding plurality of terminals T. Adjacent each holding chamber 2 is flexing space 3 and an elastic piece 4. As terminal T is inserted into chamber 2, it contacts elastic piece 4 and bends it into flexing space 3. When terminal T is fully inserted into chamber 2, elastic piece 4 is permitted to spring back into chamber 2 and thereby prevent terminal T from being withdrawn or inadvertently slipping out.

Testing device 6 comprises a plurality of testing blocks 8 in holder 7. Each testing block can move freely and independently of the others and comprises check pin 8A and probe 8B. Each probe 8B is connected to a continuity tester circuit (not shown).

In operation, connector 1 is inserted into holder 7. If terminal T is properly inserted, elastic piece 4 moves out of flexing space 3 and into chamber 2. This allows check pin 8A to enter fully into flexing space 3. When this occurs, probe 8B contacts terminal T and the testing circuit is complete.

On the other hand, if terminal T is incompletely inserted, elastic piece 4 occupies flexing space 3, thereby preventing check pin 8A from entering. As a result, testing block 8 moves away from holder 7 so that probe 8B does not contact terminal T. Thus, the circuit is not complete, a fact which is signaled to the operator.

In the prior art device described above, each testing block 8 can move independently relative to holder 7. Therefore, each block requires a separate spring to allow it to return to its original position, thus complicating the structure. This increases costs, makes assembly more complicated, and causes maintenance to be more difficult. Moreover, there is reduced freedom in the disposition of test blocks 8. As a result, it becomes difficult to apply testing device 6 to connectors having differing arrangements and numbers of terminals, thus limiting the applications for which tester 6 can be used.

SUMMARY OF THE INVENTION

In view of the foregoing, it is an object of the Invention to simplify the structure of the testing device and, at the same time, permit it to be used in a wider range of applications.

The connector of the present Invention comprises a housing containing a plurality of terminal chambers, each adapted to receive and hold a terminal. A resilient tongue is provided adjacent one side of each holding chamber and is adapted to be engaged and disengaged by the insertion of the terminal. As the terminal is inserted, it first moves the tongue into the flexing space adjacent the chamber and, when the terminal is fully inserted, it allows the tongue to move back into the chamber and prevents withdrawal of the terminal. On the other hand, if the terminal is not fully inserted into the terminal holding chamber, the resilient tongue remains in the flexing space.

The testing is carried out by moving the connector and the holder close together. If the terminal is properly inserted, the check pin is free to enter the flexing space. The probe, affixed to or part of the check pin enters the terminal chamber and makes electrical contact with the terminal, thus indicating that it has been correctly inserted.

However, if one or more of the terminals is only partially inserted, the resilient tongue remains in the flexing space. Therefore, the check pin cannot enter and the movement of the probe toward the holder is prevented. As a result, the probe does not contact the terminal, thus indicating the defect to the operator.

A plurality of attachment holes (preferably of circular cross-section) is formed on the probe holder. Complementary pins are fitted in these holes, so that a plurality of units can be positioned relative to one another. Since such holes can be formed by drilling, it is possible to position them precisely; thus, these holes need not be formed by molding, thereby saving considerable cost.

There is also provided a connector support adapted to receive the housing containing the terminals to be tested, a probe support adapted to receive the probe holder, and an actuating mechanism which is capable of moving the probe support (and the holder contained therein) and/or the connector support toward and away from each other. There is also provided a spring urging the probe holder and connector support toward one another.

As testing is carried out, the actuating mechanism moves the connector support and the probe support a predetermined distance toward each other. If the terminal is properly inserted, the holder in the probe support is not displaced relative to the connector support. In this condition, the check pin moves readily into the flexing space and the probe moves into the terminal chamber, thereby making contact with the terminal itself.

Alternatively, if the terminal is incompletely inserted, the resilient tongue remains in the flexing space. The check pin is prevented from entering the flexing space by the resilient tongue, and the probe holder, against the pressure of the spring, moves away from the connector support. Preferably circular guide holes are formed in the probe support and the probe holder. Guide rods are inserted through these holes and the probe holder is capable of sliding thereon to move toward or away from the connector and its support. It is a feature of the present Invention that the probe holder and the probe support need not be metal molded, since the guide holes can be precisely formed by cutting, thereby accurately positioning the testing unit and reducing the cost of production.

It is a feature of the present Invention that the check pin and probe are integral with the probe holder. In this manner, the construction is simpler than the one wherein the check pins and the probes can move independently of the probe holder. Moreover, since the probes can be individually removed from the holder, wide flexibility of the device is achieved. Furthermore, since metal molds are not needed to produce the holder, substantial production costs can be saved.

It is a preferred form of the Invention that an actuating mechanism be provided so that the connector support and the probe support can be moved toward each other by a predetermined distance. The relative positioning of the connector and the probe support is fixed during testing, thus increasing the reliability thereof.

Moreover, if the terminal is completely inserted, the test contact is prevented from impacting the resilient tongue with excessive force, since the probe holder is capable of sliding on the guide rods within the probe support. Here, too, production costs can be minimized since expensive molds are not needed to produce either the probe holder or the probe support.

BRIEF DESCRIPTION OF THE DRAWINGS

In the accompanying drawings, constituting a part hereof, and in which like reference characters indicate like parts.

DETAILED DESCRIPTION OF THE INVENTION

Figure 1:
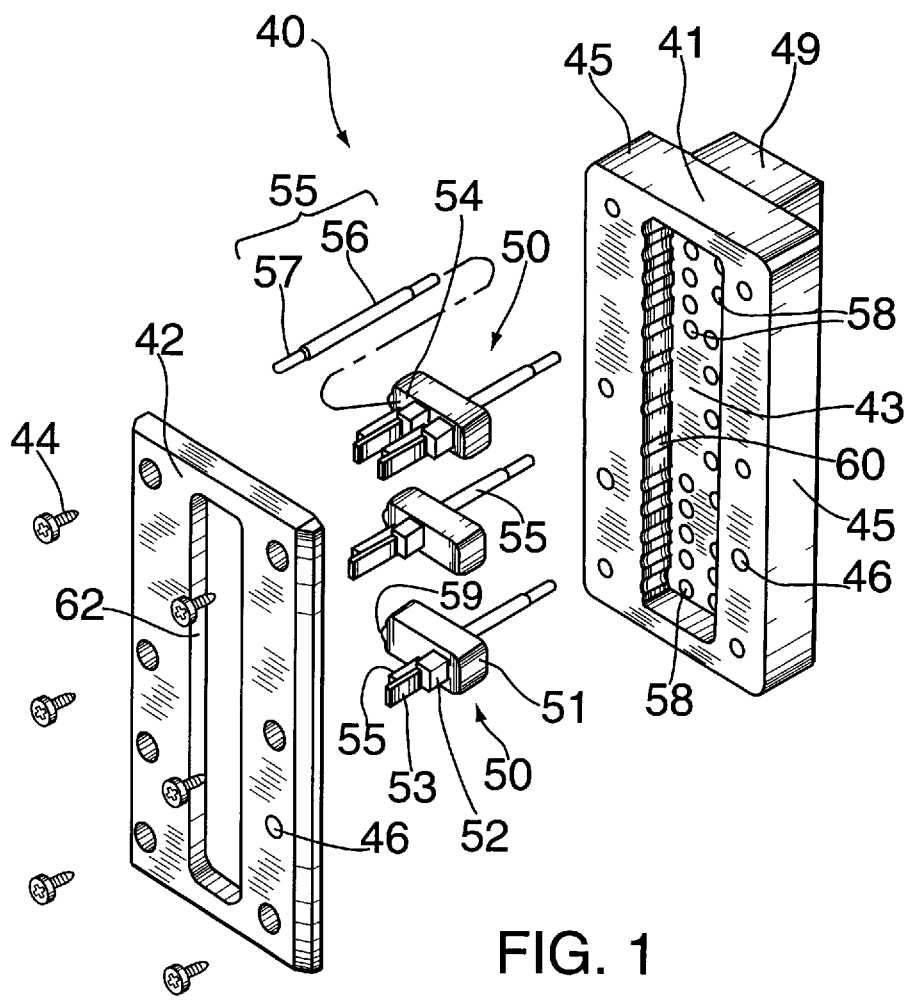
FIG. 1 is an exploded perspective view of the probe and probe holder.

Connector 10 comprises housing 11 containing a plurality of terminal chambers 12, each adapted to receive metal terminal 13. Each of terminal chambers 12 is provided with inwardly biased resilient tongue 14. Flexing space 15 is located adjacent resilient tongue 14 and is adapted to receive it as terminal 13 is inserted into its corresponding terminal chamber 12.

Insertion of terminal 13 into chamber 12 causes resilient tongue 14 to move into flexing space 15. When terminal 13 has entered fully into chamber 12, resilient tongue 14 then springs back into chamber 12 and bears against terminal 13, thereby preventing it from being withdrawn. On the other hand, if terminal 13 is not fully into chamber 12, resilient tongue 14 is retained in flexing space 15.

Both terminal chambers 12 and flexing spaces 15 are open to the front of connector housing 11. This permits check pin 53, under proper circumstances, to enter flexing space 15 and probe 55 to be inserted into the opening in terminal chamber 12. Testing device 20 comprises base 21, connector support 22, probe support 23, and actuating mechanism 24. Actuating mechanism 24 comprises guide groove 25 in base 21 and lever 27 which moves probe support 23 in guide groove 25.

Connector support 22 is located at a predetermined position by fitting its lower end into guide groove 25. It may be secured by a bolt or other known means. Connector support 22 comprises support slot 26 which opens upward and is adapted to receive housing 11 of connector 10. When connector 10 is inserted, it is securely and firmly held in its predetermined position and orientation. The back of connector support 22 is open to allow wires W to pass through. The front of connector support 22 is also open to face probe holder 40 and allow probe 55 to have access to terminals 13.

Probe holder 40 comprises body 41, cover 42 and probes 55. Body 41 is of T-shaped cross section, having fitting portion 49 and guide ribs 45. Unit holder 43 is adapted to receive probes 55. Attachment holes 58 locate various probes 55 in the requisite positions necessary to properly contact terminals 13 in the particular connector 10 being tested. Testing units 50 comprise test blocks 51 having reinforcements 52 and check pins 53 mounted thereon. Each of probes 55 comprises hollow cylinder 56 with a coil spring (not shown) and test contact 57 slidably mounted therein. Test contact 57 is biased toward connector support 22 by the aforementioned coil spring. Each of probes 55 is mounted on test block 51 and is integral therewith. Cylinders 56 of probes 55 are inserted into the appropriate attachment holes 58 in unit holder 43. Keys 59 slide in key ways 60 to further secure probes 55 in their appropriate and proper positions.

Figure 2:
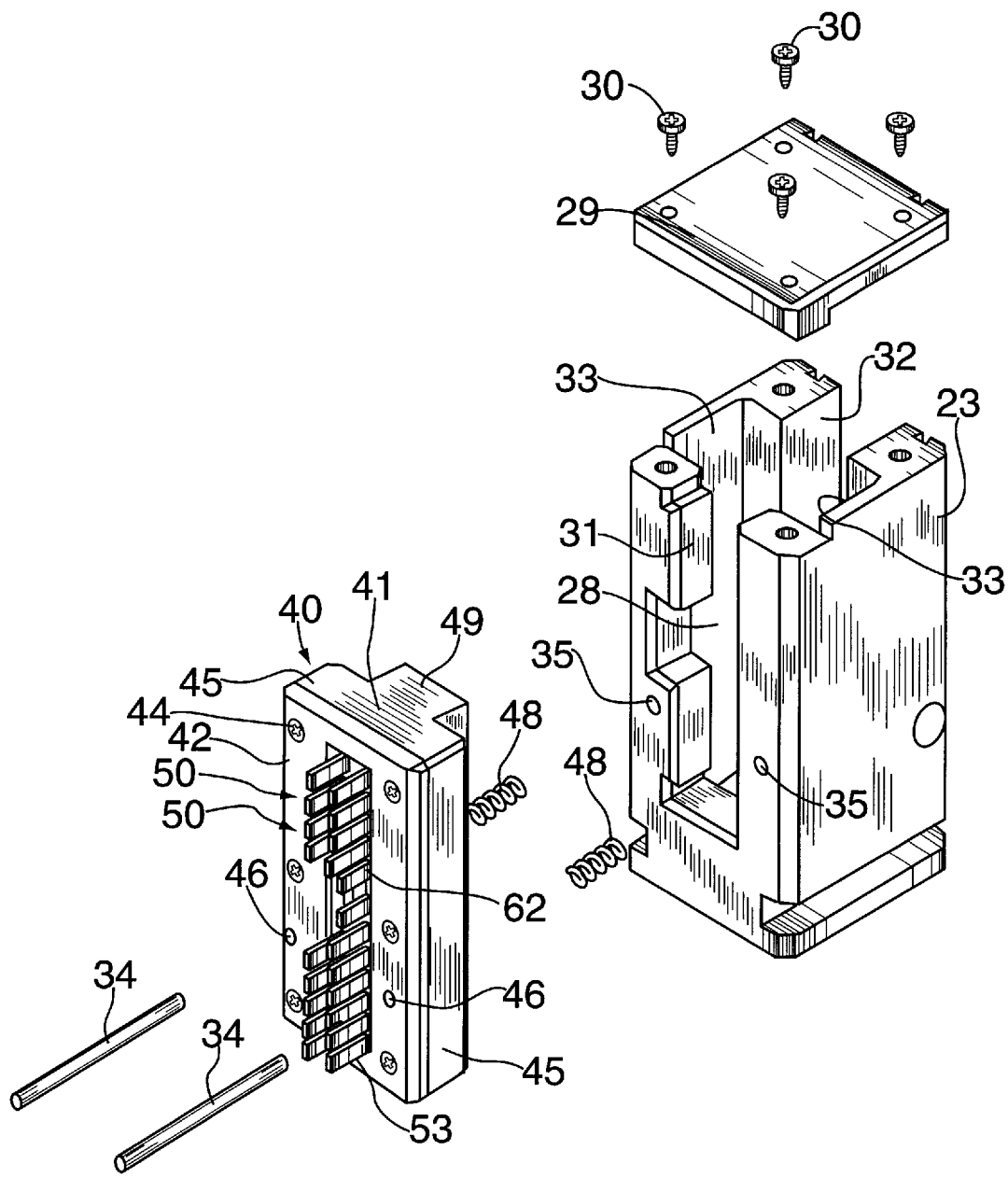
FIG. 2 is an exploded perspective view of the probe holder and the probe support.

Cover 42 is secured to the front face of body 41 by screws 44. Cover slot 62 allows check pin 53 and test contact 57 to protrude therefrom. Referring primarily to FIG. 2, probe support 23 is provided with guides 33, escape portion 32, connector receptacle 31, and holding chamber 28. A groove is provided adjacent the bottom of probe support 23 which is adapted to engage guide groove 25.

Guide ribs 45 of probe holder 40 are inserted into guides 33 of probe support 23. The thickness of guide ribs 45 is less than the distance between the front and rear walls of guides 33 and fitting portion 49 fits slidably within escape portion 32. Thus, probe holder 40 can move within and relative to probe support 23.

Guide holes 46 and receiving holes 35 are in alignment so that, after probe holder 40 has been inserted into probe support 23, guide pins 34 are passed through receiving holes 35, guide holes 46, coil springs 48 and into guide holes (not shown) on the back wall of probe support 23. Probe holder 40 then rides on guide pins 34, being biased toward connector support 22 by coil springs 48. Lid 29 is placed on top of probe support 23 and secured thereto by screws 30. The completed combination is then placed on base 21 and held by guide groove 25.

Connector 10 to be tested is inserted into the open end of support slot 26. Lever 27 is actuated causing probe support 23 to move toward connector support 22. If all of terminals 13 are fully inserted into chambers 12, resilient tongues 14 will have all reentered chambers 12 and vacated flexing spaces 15. Check pins 53 then easily enter corresponding flexing spaces 15 and test contact 57 of probe 55 makes electrical contact with terminals 13. This completes the circuit and indicates to the operator that connector 10 has been properly assembled.

Figure 5:
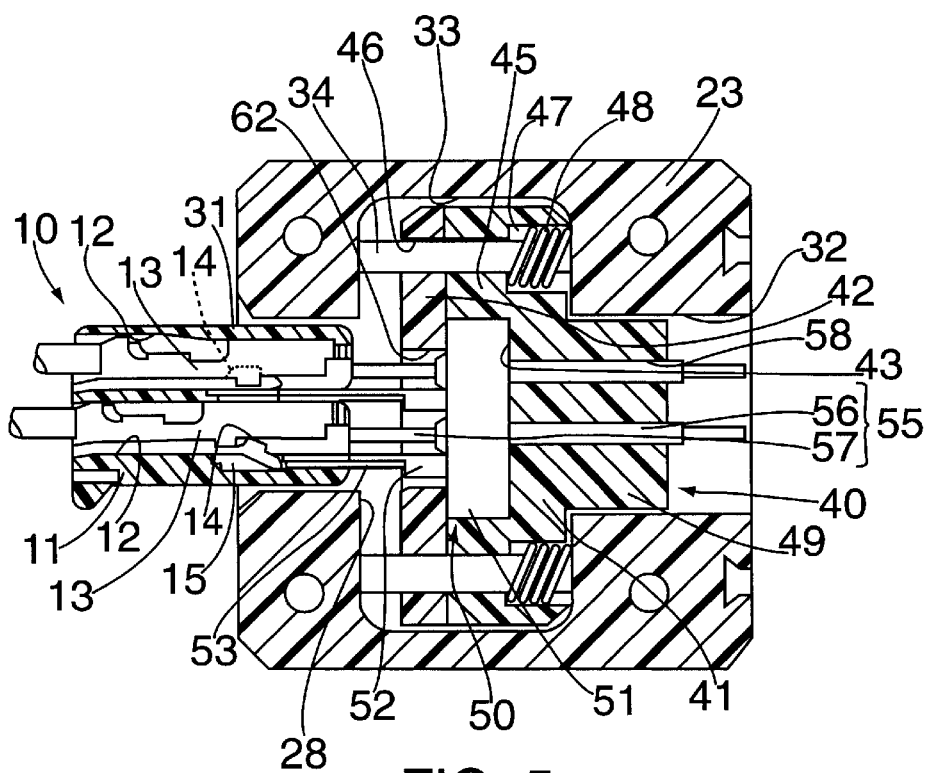
FIG. 5 is a cross section, similar to that of FIG. 4, in which the lower terminal is incompletely inserted.
Figure 6:
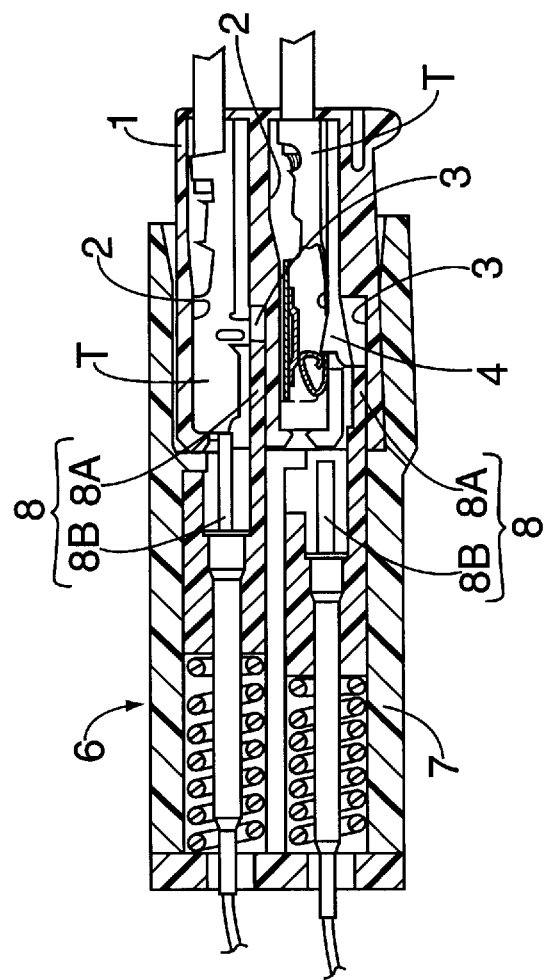
FIG. 6 is a cross section of a prior art device.

In FIG. 5, lower terminal 13 has not been fully inserted into terminal chambers 12. As a result, corresponding resilient tongue 14 remains in its flexing space 15. As probe support 23 is moved toward connector support 22, check pins 53 attempt to enter flexing spaces 15. However, since one space 15 is occupied by resilient tongue 14, it cannot do so. Therefore, body 41 slides within probe support 23 in a direction away from connector support 22. Moreover, since cylinder 56 contains a coil spring, test contact 57 is resilient, thereby preventing any damage to itself or terminal 13.

Figure 3:
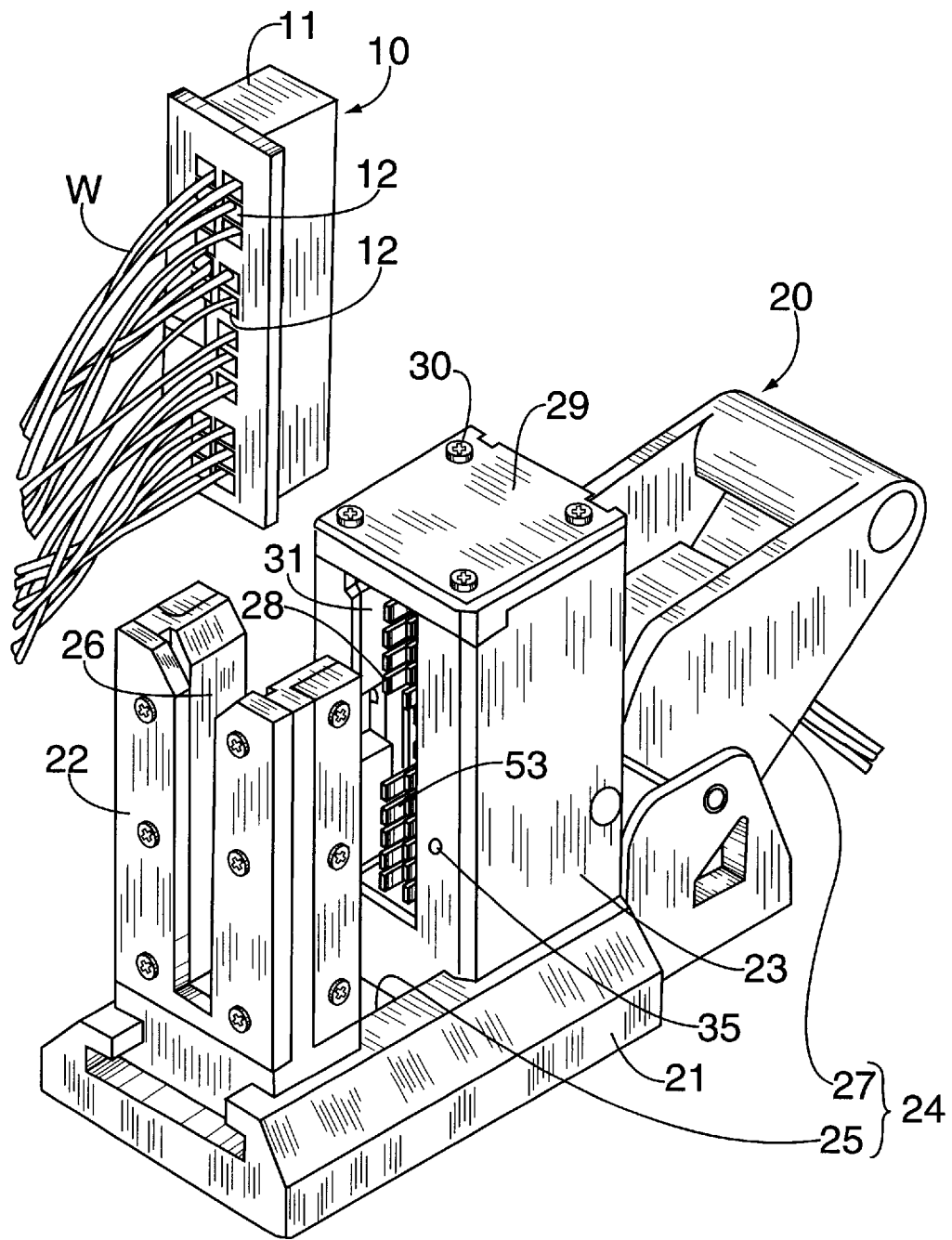
FIG. 3 is a perspective view of the entire device with the connector separate.
Figure 4:
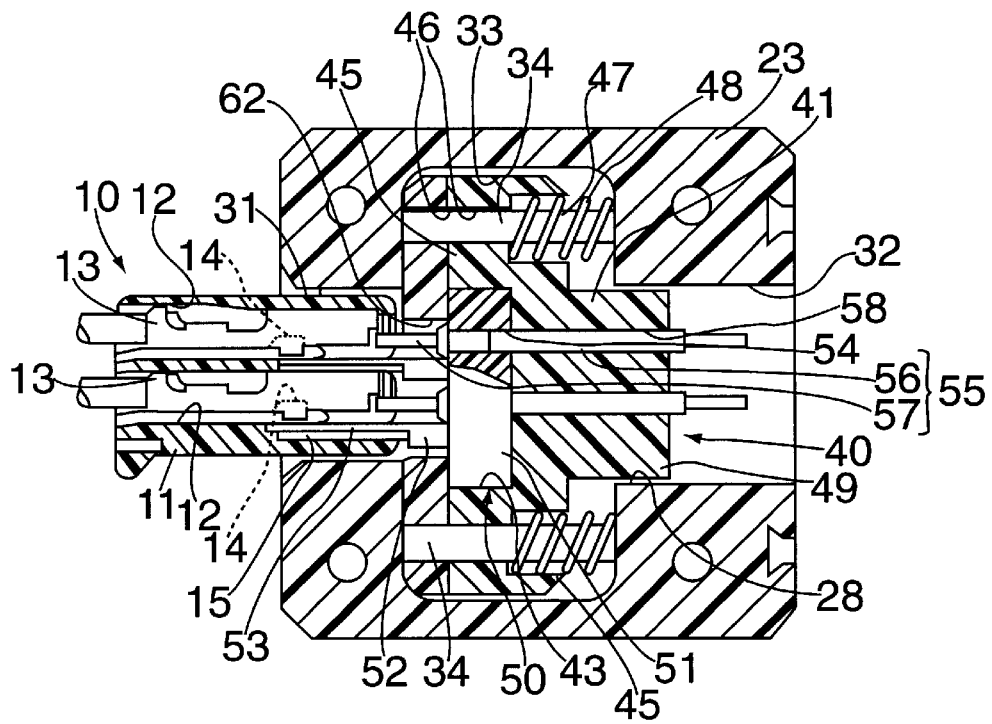
FIG. 4 is a schematic horizontal view partly in cross section with the Invention in testing position and the terminals properly inserted.

In the device as shown in FIG. 3, probe support 23 is spring biased away from connector support 22. As lever 27 is actuated, it urges probe support 23, against the force of the spring, toward connector support 22. Upon release, the two separate, allowing easy removal of connector 10 and insertion of the next connector to be tested.

While only a limited number of specific embodiments of the present Invention have been expressly disclosed it is, nonetheless, to be broadly construed and not to be limited except by the character of the claims appended hereto.

What we claim is:

1. A device for testing a connector, wherein said connector comprises a plurality of terminal chambers, an electrical terminal in each of said terminal chambers, a flexing space adjacent each of said terminal chambers and adapted to receive a resilient tongue, said tongue being biased away from said flexing space and toward said terminal chamber, whereby said tongue is pressed into said flexing space by said terminal as it is inserted into said terminal chamber and said tongue flexes out of said flexing space into said terminal chamber when said terminal is fully inserted into said terminal chamber, said device comprises a probe holder including a body containing a plurality of testing units integrally mounted thereon, said body being slidable on a base between an adjacent position, wherein said testing units are in contact with said connector, and a remote position, wherein said testing units are out of contact with said connector, a probe support, having a holding chamber thereon, a connector support, adapted to receive said connector and open toward said body, a support slot in said connector support which is open at an end remote from said base, said holding chamber being open at an end remote from base, whereby said connector can be inserted into said connector support and said body can be inserted into said probe support, each of said testing units comprising a test block having a check pin and a probe mounted thereon, said check pin adapted to enter said flexing space when said flexing space is not occupied by said resilient tongue, said check pin further adapted to be prevented from entering said flexing space when said flexing space is occupied by said resilient tongue, whereby, when at least one said resilient tongue occupies said flexing space, all of said probes are prevented from contacting said terminal and, when said resilient tongue does not occupy said flexing space all of said probes are permitted to contact said terminal.

2. The device of claim 1 wherein said holding chamber comprising at least one guide and an escape portion, said holding chamber adapted to receive said body, said body having at least one guide rib complementary to said guide and capable of slidable movement therein in a direction toward and away from said connector, at least one support spring urging said body toward said connector.

3. The device of claim 2 wherein said body is provided with a fitting portion adapted to slide in said escape portion in said direction.

4. The device of claim 2 wherein there is a pair of guides in said holding chamber and a pair of guide ribs on said body.

5. The device of claim 1 comprising an actuator on said base which can move said probe support and connector support toward and away from each other.

6. The device of claim 5 wherein a biasing spring urges said probe support and said conductor support toward each other.

7. The device of claim 1 wherein there is a guide groove on said base and said probe support and said connector support are slidably mounted therein.

8. The device of claim 1 wherein said connector support is stationary on said base and said probe support is movable.

9. The device of claim 1 wherein at least one guide pin is in said holding chamber and passes through said body, whereby said body can slide on said guide pin in a horizontal direction toward and away from said connector.

10. The device of claim 9 wherein at least one support spring is on said guide pin.

11. The device of claim 9 wherein there are two guide pins, spaced apart transversely to said direction.

12. The device of claim 11 wherein there is a support spring on each of said guide pins.

13. A device for testing a connector, wherein said connector comprises a plurality of terminal chambers, an electrical terminal in each of said terminal chambers, a flexing space adjacent each of said terminal chambers and adapted to receive a resilient tongue, said tongue being biased away from said flexing space and toward said terminal chamber, whereby said tongue is pressed into said flexing space by said terminal as it is inserted into said terminal chamber and said tongue flexes out of said flexing space into said terminal chamber when said terminal is fully inserted into said terminal chamber, said device comprises a probe holder including a body containing a plurality of testing units secured to said body, said body being movable between an adjacent position, wherein said testing units are in contact with said connector, and a remote position, wherein said testing units are out of contact with said connector, said body comprising a unit holder in said body and open at a surface facing said connector, a rear wall of said unit holder, remote from said surface, having a plurality of attachment holes therein, a portion of each of said testing units in at least some of said attachment holes, each of said testing units comprising a test block having a check pin and a probe mounted thereon, said check pin adapted to enter said flexing space when said flexing space is not occupied by said resilient tongue, said check pin further adapted to be prevented from entering said flexing space when said flexing space is occupied by said resilient tongue, a key on a lateral surface of said test block and a complementary keyway on a corresponding lateral wall, whereby said test block is retained in said unit holder, whereby, when at least one said resilient tongue occupies said flexing space, all of said probes are prevented from contacting said terminal and, when said resilient tongue does not occupy said flexing space all of said probes are permitted to contact said terminal.

* * * * *